(12) United States Patent
Arakawa

(10) Patent No.: US 6,774,494 B2
(45) Date of Patent: Aug. 10, 2004

(54) SEMICONDUCTOR DEVICE AND MANUFACTURING METHOD THEREOF

(75) Inventor: Hideyuki Arakawa, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/934,643

(22) Filed: Aug. 23, 2001

(65) Prior Publication Data

US 2002/0137327 A1 Sep. 26, 2002

(30) Foreign Application Priority Data

Mar. 22, 2001 (JP) .......................... 2001-082631

(51) Int. Cl.[7] .......................... H01L 23/48; H01L 23/52
(52) U.S. Cl. .................. 257/779; 257/784; 257/786; 438/106; 438/118
(58) Field of Search ................. 438/106–108, 438/118, 123, 127; 257/777–779, 784, 786, 787

(56) References Cited

U.S. PATENT DOCUMENTS 6,133,637 A * 10/2000 Hikita et al. ................ 257/777
6,426,563 B1 * 7/2002 Fujihira ...................... 257/780

FOREIGN PATENT DOCUMENTS

| JP | 08-186117 | * 7/1996 | ......... H01L/21/321 |
| JP | 8-340018 | 12/1996 | |
| JP | 10-335368 | 12/1998 | |

* cited by examiner

*Primary Examiner*—Hsien Ming Lee
(74) *Attorney, Agent, or Firm*—Leydig, Voit & Mayer, Ltd.

(57) ABSTRACT

A semiconductor device includes an inner lead, a first ball on the inner lead, a bonding pad on the semiconductor device, a second ball on the bonding pad, and a bonding wire connecting the first and second balls. The second ball is formed by mechanically deforming the bonding wire.

6 Claims, 10 Drawing Sheets

SEMICONDUCTOR DEVICE AND MANUFACTURING METHOD THEREOF

BACKGROUND OF THE INVENTION

1. Field of the Invention

The present invention relates to a method of wire bonding and to a semiconductor device manufactured through the method. More particularly, the present invention relates to a method of wire bonding enabling high speed bonding and applicable to thin packages, compact-sized, large capacity packages and multifunctional packages, as well as to a semiconductor device manufactured through the use of the method.

2. Description of the Background Art

In order to meet the current trend of semiconductor package developments of compact size, large capacity and multiple functions, there have been various requirements on the method of wire connection between a semiconductor element in a package and an external terminal of the package.

Figure 8:
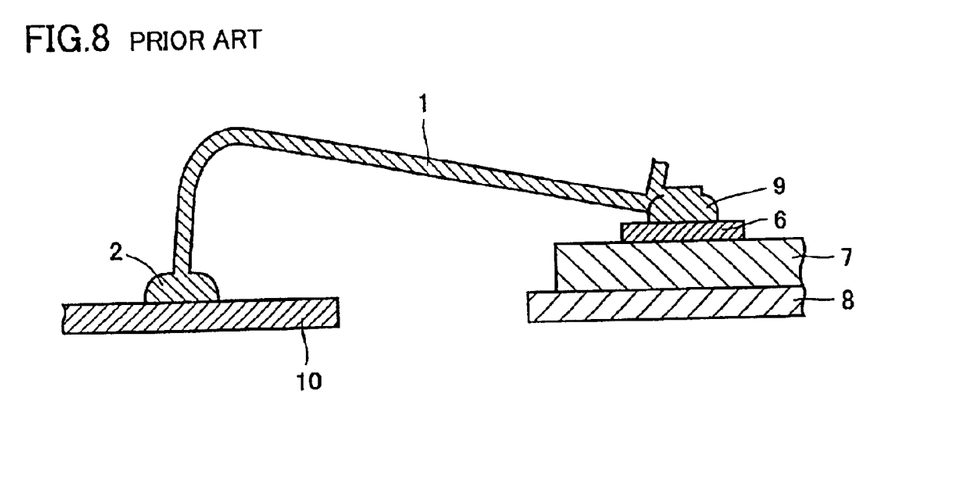
FIG. 8 is a cross sectional view showing an example (reverse loop) of a conventional method of wire connection.
Figure 9:
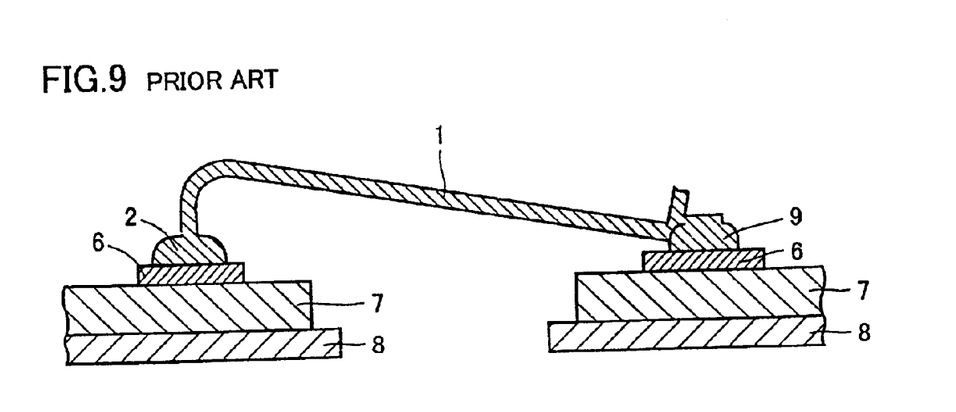
FIG. 9 is a cross sectional view showing another example (chip-to-chip loop) of a conventional method of wire connection.

A reverse loop such as shown in FIG. 8, or a chip-to-chip loop such as shown in FIG. 9 has been used for a thin package, a compact-sized, large capacity package and a multifunctional package.

When a reverse loop such as shown in FIG. 8 is utilized, an inner lead 10 and a bonding pad 6 are connected by means of a first ball 2, a bonding wire 1, and a stud bump (second ball) 9. Bonding pad 6 is formed on a semiconductor device (chip) 7 mounted on a die pad 8.

When a chip-to-chip loop such as shown in FIG. 9 is utilized, bonding pads 6 on semiconductor device 7 are connected to each other by means of first ball 2, the bonding wire 1, and stud bump (second ball) 9.

Figure 10:
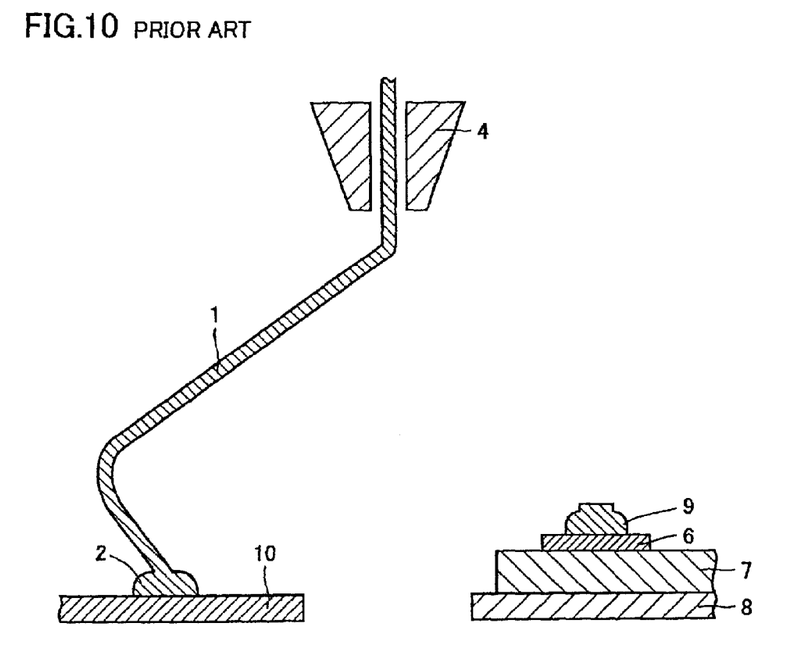
FIGS. 10 and 11 are cross sectional views showing the first and second steps of on-bump secondary bonding.
Figure 11:
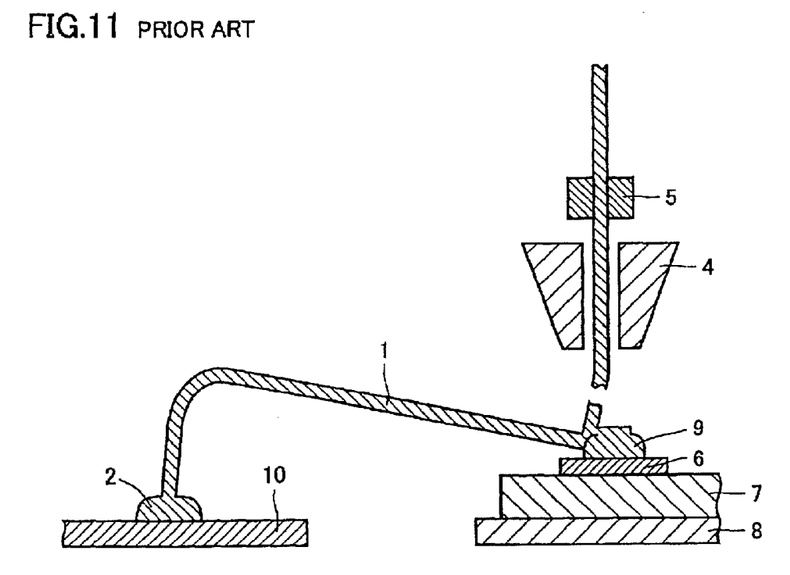

In the reverse loop or chip-to-chip technique, secondary bonding is performed on the bonding pad 6 on the chip. Here, a stud bump 9 is formed in advance on bonding pad 6 as shown in FIG. 10, and the secondary bonding is performed on stud bump 9, using a capillary 4 and a wire cut damper 5 as shown in FIG. 11. Namely, an on-bump secondary bonding technique is used. In the on-bump secondary bonding technique, the step of arranging a stud bump is necessary, separate from the step of arranging the wire. This results in larger number of steps required for wire bonding, resulting in low efficiency in manufacturing the semiconductor devices.

Figure 12:
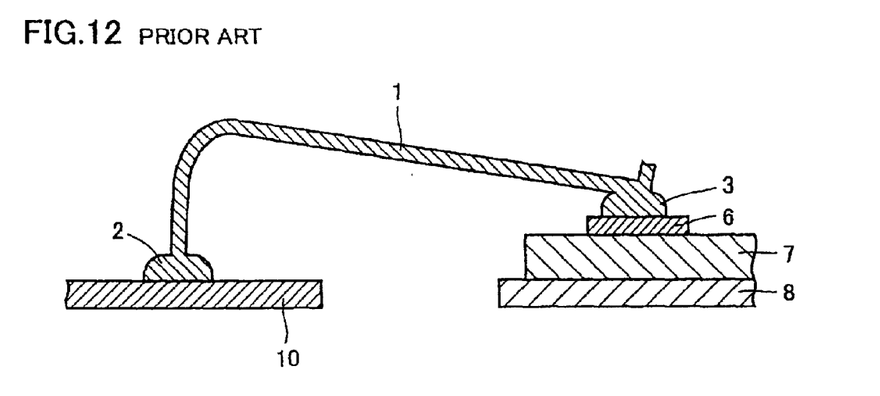
FIG. 12 is a partial cross sectional view of the semiconductor device to which the conventional ball-to-ball bonding technique is applied.

There is a wire bonding technique that overcomes the disadvantages of the on-bump secondary bonding technique and improves productivity. In this technique, ball bonding is performed both for the primary and secondary bondings (hereinafter referred to as "ball-to-ball bonding"). FIG. 12 shows an example in which inner lead 10 and a bonding pad 6 are connected by means of bonding wire 1 through ball-to-ball bonding.

Figure 13:
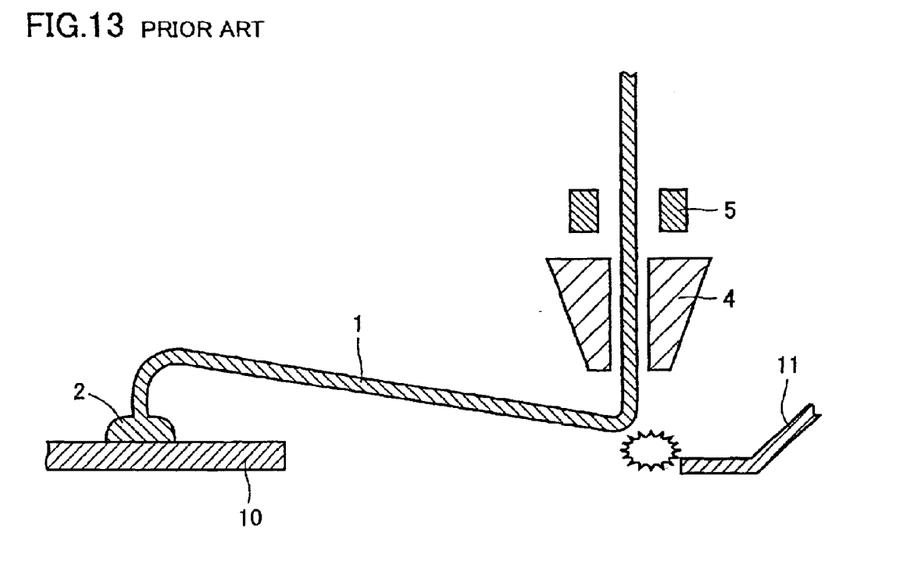
FIGS. 13 to 15 are cross sectional views showing the first to third steps of the conventional ball-to-ball bonding.
Figure 14:
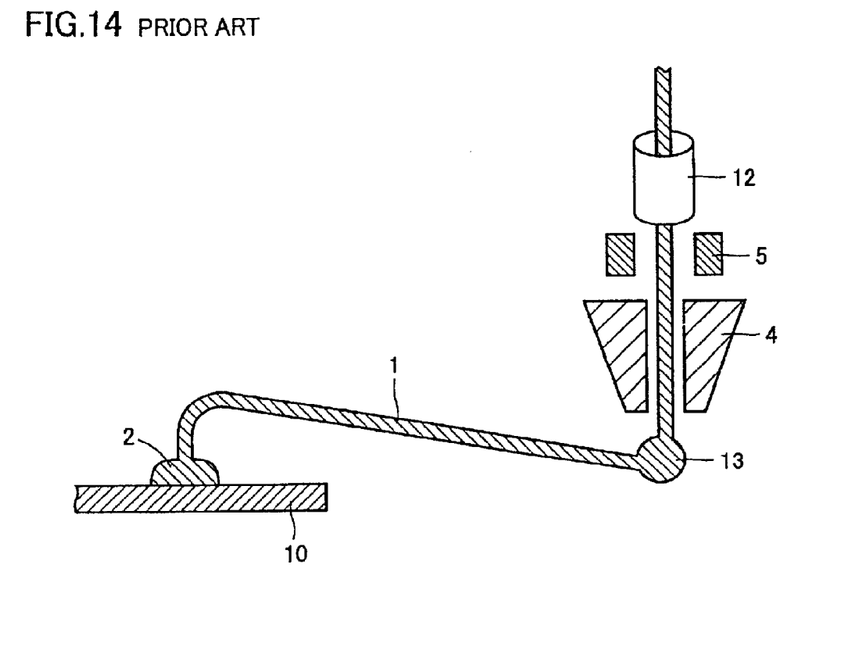
Figure 15:
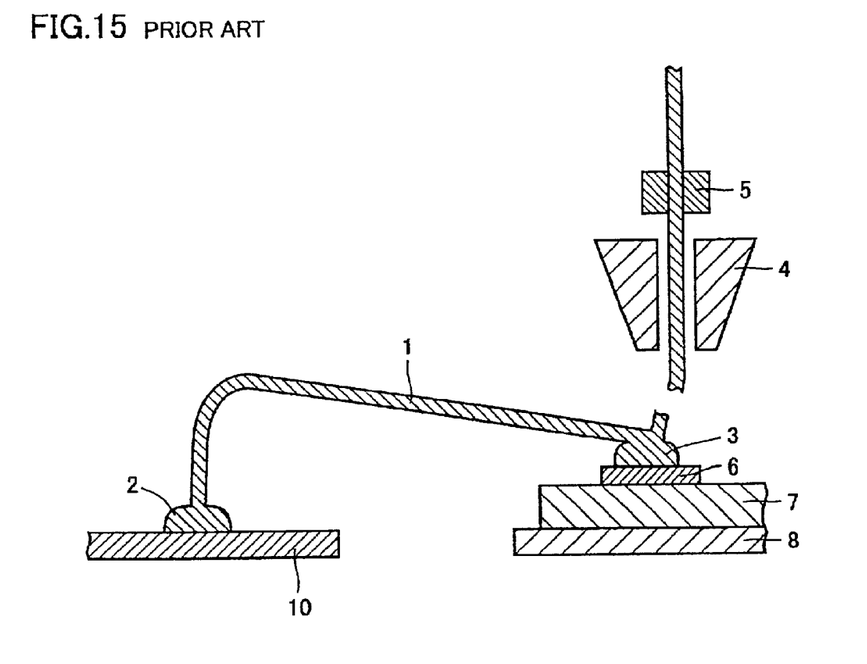

In the ball-to-ball bonding, primary bonding is performed by forming a first ball 2 by common spark discharge at a wire tip portion. Thereafter, spark discharge is performed using a torch electrode 11 at a desired wire ball forming portion as shown in FIG. 13, so that a melted ball (second ball) 13 is formed as shown in FIG. 14. Thereafter, air is blown out from an air outlet 12 to hold the melted ball 13. The melted ball 13 is bonded to the bonding pad 6 as shown in FIG. 15, and thus the secondary bonding is performed.

When the second ball is formed by melting the bonding wire in the above described manner, however, it is difficult to form the second ball at a prescribed position with high accuracy. Therefore, loop control becomes difficult, as the wire becomes too tense or too slack for the wire loop.

As stable formation of the second ball by melting is difficult, joining attained by the second ball bond is unstable.

Accordingly, stable and high-speed ball-to-ball bonding is difficult, which degrades productivity of the semiconductor device and, in addition, poses questions on the quality of the semiconductor devices.

SUMMARY OF THE INVENTION

The present invention was made to solve the above described problems. An object of the present invention is to improve not only the quality but also the productivity of the semiconductor devices, by performing stable and high-speed ball-to-ball bonding.

According to the present invention, the semiconductor device includes a first conductive layer, a first ball (bump) formed on the first conductive layer, a second conductive layer positioned spaced apart from the first conductive layer, a second ball (bump) formed on the second conductive layer, and a bonding wire connecting the first and second balls. The second ball is formed by mechanically deforming the bonding wire. Here, "ball" refers to a lump conductive portion, including conductive portions having spherical shapes and other shapes.

As the second ball is formed by mechanically deforming the bonding wire as mentioned above, it is possible to form the second ball by mechanically deforming the bonding wire after the bonding wire is preliminarily joined to the second conductive layer. More specifically, it is possible to perform the secondary bonding after the shape of the wire loop is established. This enables easy and highly accurate loop control of the bonding wire. Further, as the second ball is formed by mechanically deforming the bonding wire, it is possible to form the second ball in a more stable and easier manner, as compared with formation of the melted ball.

The second ball may be formed by bending the bonding wire on the second conductive layer, or the second ball may be formed by making the bonding wire curved on the second conductive layer. In either way, the bonding wire can be mechanically deformed to attain the above described effects.

The first conductive layer includes an inner lead, and the second conductive layer includes a bonding pad. As the present invention is applied to connection between the inner lead and the bonding pad, it becomes possible to improve controllability of the loop shape of the bonding wire connecting the inner lead and the bonding pad and, in addition, it becomes possible to ensure reliability and stability of joint on the bonding pad.

The semiconductor device may include a base, a semiconductor device mounted on the base with a die pad interposed, a sealing resin sealing the semiconductor device, and an external terminal formed on a rear surface of the base. Here, the first conductive layer includes a land formed on the base, and the second conductive layer includes a bonding pad formed on the semiconductor device.

The present invention is also applicable to connection between the land formed on the base and the bonding pad formed on the semiconductor device by means of a wire. In this case also, controllability of the loop shape of the bonding wire is improved while stability and reliability of joint on the bonding pad can be ensured.

The semiconductor device may include a base, first and second semiconductor devices mounted on the base with a die pad interposed, a sealing resin sealing the first and second semiconductor devices, and an external terminal formed on the rear surface of the base. Here, the first conductive layer includes a first bonding pad formed on the first semiconductor device, and the second conductive layer includes a second bonding pad formed on the second semiconductor device.

The present invention is also applicable to wire connection between bonding pads formed on the first and second semiconductor devices mounted on the base. In this case also, controllability of the wire loop shape is improved while stability and reliability on the bonding pads can be ensured.

According to the present invention, the method of manufacturing a semiconductor device includes the following steps. First, a first ball formed at the tip of the bonding wire is joined to a first conductive layer (first bonding step). After the first bonding step, the bonding wire is joined to the second conductive layer. With the bonding wire joined to the second conductive layer, the bonding wire is mechanically deformed on the second conductive layer. The deformed portion of the bonding wire is joined to the second conductive layer (second bonding step).

As the bonding wire is preliminarily joined to the second conductive layer after the first bonding step, the shape of the wire loop can be established. Therefore, as compared with the prior art in which the melted ball is formed, control of the wire loop is easier. Further, as the bonding wire is mechanically deformed with the bonding wire joined to the second conductive layer, the deformed portion of the bonding wire can surely be formed at a desired position. As the second ball can be formed simply by joining the deformed portion to the second conductive layer, the second ball can be formed easily and stably. Further, as the deformed portion of the bonding wire is joined to the second conductive layer after the bonding wire is once joined to the second conductive layer, stability of the joint between the second ball and the second conductive layer can be improved.

The step of mechanically deforming the bonding wire may include the step of bending the bonding wire on the second conductive layer, or it may include the step of making the bonding wire curved on the second conductive layer. By either step, the bonding wire can be deformed mechanically on the second conductive layer, and hence the above described effects can be attained.

The bonding wire is held by a bonding tool such as a capillary. Here, the step of mechanically deforming the bonding wire includes the step of mechanically deforming the bonding wire on the second conductive layer by moving the bonding tool with the bonding wire being joined to the second conductive layer.

As the bonding tool is moved with the bonding wire joined to the second conductive layer, it becomes possible to feed the bonding wire from the bonding tool on the second conductive layer, and the fed portion can be mechanically deformed on the second conductive layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An important feature of the present invention is that in ball-to-ball bonding technique in which both the first and second bondings are established by ball bonding, formation of the second ball is realized by mechanical deformation of the wire.

Embodiments of the present invention will be described in the following with reference to FIGS. 1 to 7.

First Embodiment

Figure 1:
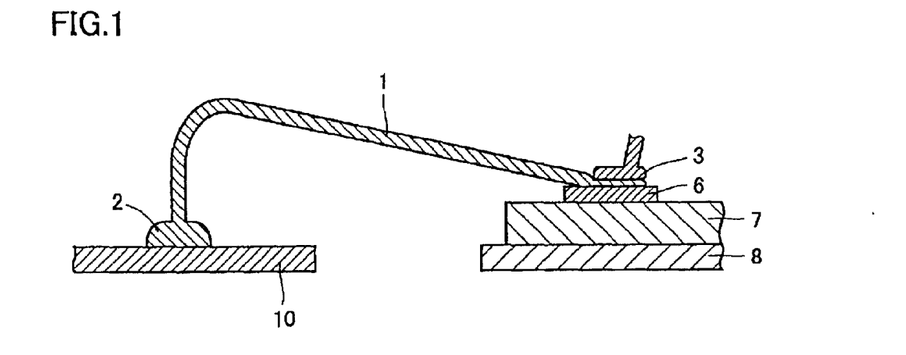
FIG. 1 is a partial cross sectional view of a semiconductor device in accordance with a first embodiment of the present invention.

FIG. 1 is a partial cross sectional view of the semiconductor device in accordance with the first embodiment of the present invention. As can be seen from FIG. 1, inner lead 10 and bonding pad 6 are connected by means of first ball 2, bonding wire 1 and second ball 3.

Second ball 3 is formed on bonding pad 6 by bonding wire 1 as shown in FIG. 1. Second ball 3 has such a shape that is realized by mechanically bending, folding and joining the wire, whereby positional accuracy of joining is improved and stability of joining is attained.

Bonding pad 6 is formed on a semiconductor device (chip) mounted on a die pad 8.

One method of forming second ball 3 by bending bonding wire 1 will be described with reference to FIGS. 2 to 5.

Figure 2:
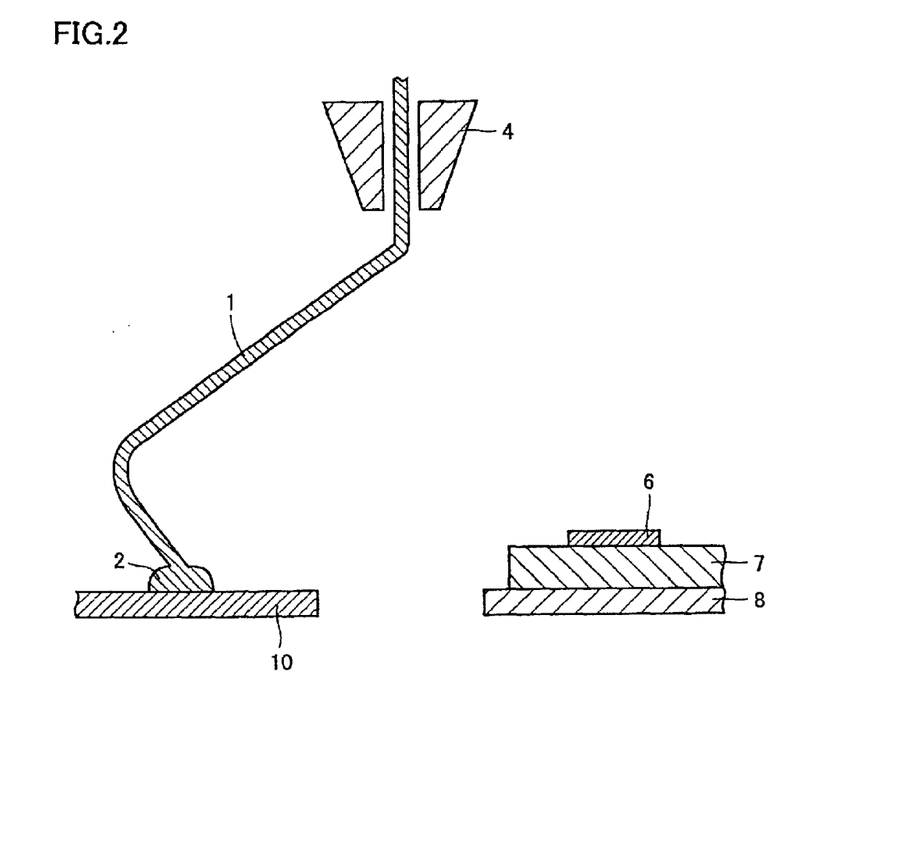
FIGS. 2 to 5 are cross sectional views showing the first to fourth steps of manufacturing the semiconductor device shown in FIG. 1.
Figure 3:
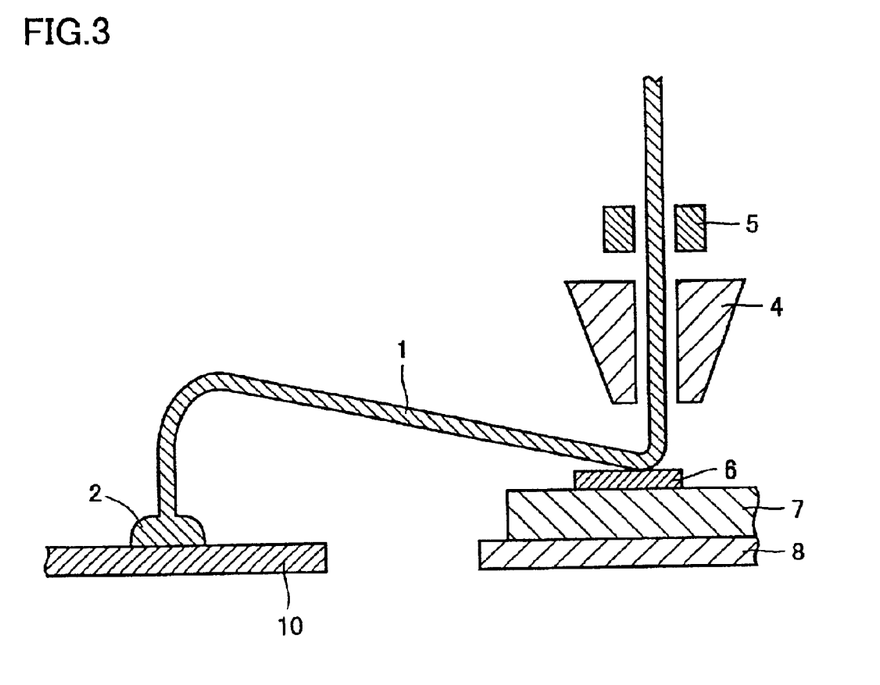

As shown in FIG. 2, first bonding is performed by a known method, so as to form the first ball 2 on inner lead 10. Thereafter, as shown in FIG. 3, bonding wire 1 is preliminarily joined on bonding pad 6. The energy for the preliminary joint is smaller by several to several tens percent of the general energy for common stitch bonding (second bonding).

Figure 4:
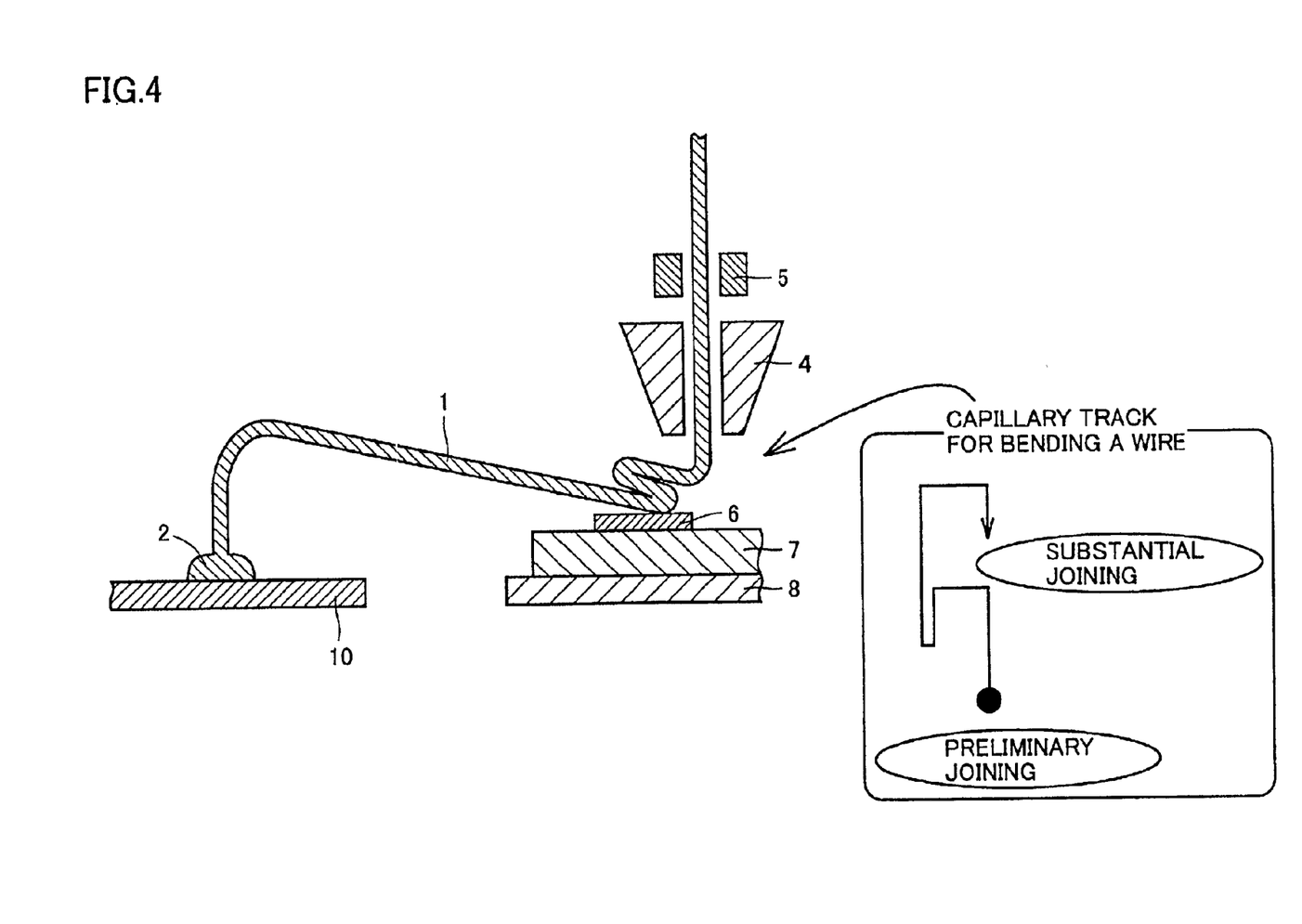

With the bonding wire 1 preliminarily joined to bonding pad 6, capillary 4 is operated, controlled to follow a basic track such as shown in FIG. 4, so that bonding wire 1 is bent on bonding pad 6.

More specifically, after the above described preliminary joining, capillary 4 is moved upward, thereafter the capillary is moved sideways, thereafter capillary 4 is once lowered and thereafter moved upward, and again, capillary 4 is moved downward.

By moving capillary 4 in this manner to draw a loop on bonding pad 6, bonding wire 1 can be bent on bonding pad 6 as shown in FIG. 4. The bent portion of bonding wire 1 is substantially joined to bonding pad 6 (main joining). The substantial bonding is performed with the energy sufficient to establish joint between the preliminarily joined bonding pad 6 and bonding wire 1 and the joint between the bent bonding wire 1.

Figure 5:
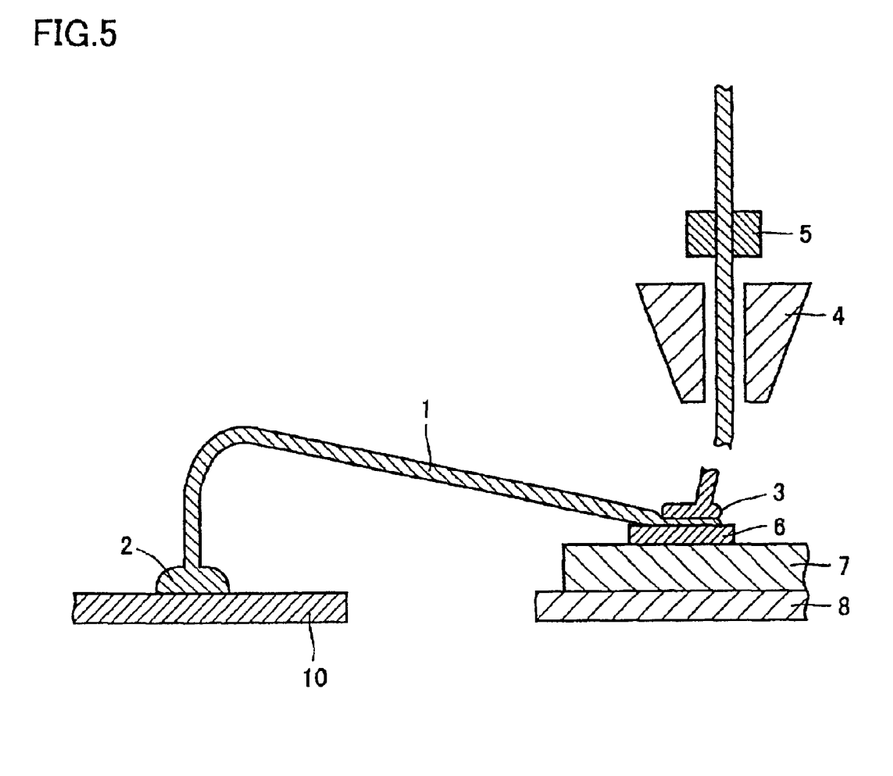

After the substantial joining, bonding wire 1 is clamped by a wire cut damper 5 as shown in FIG. 5, and the bonding wire 1 is cut. Thus, the structure shown in FIG. 1 results.

As the second ball 3 is formed by mechanical deformation of bonding wire 1 as described above, the positional accuracy in forming the ball can be improved as compared with the conventional second ball formed by melting, and control of the wire loop can be performed with higher accuracy. Further, as the second ball bonding is performed by two steps of joining, that is, preliminary joining and the substantial joining, stability of the joint can also be improved.

Second Embodiment

Figure 6:
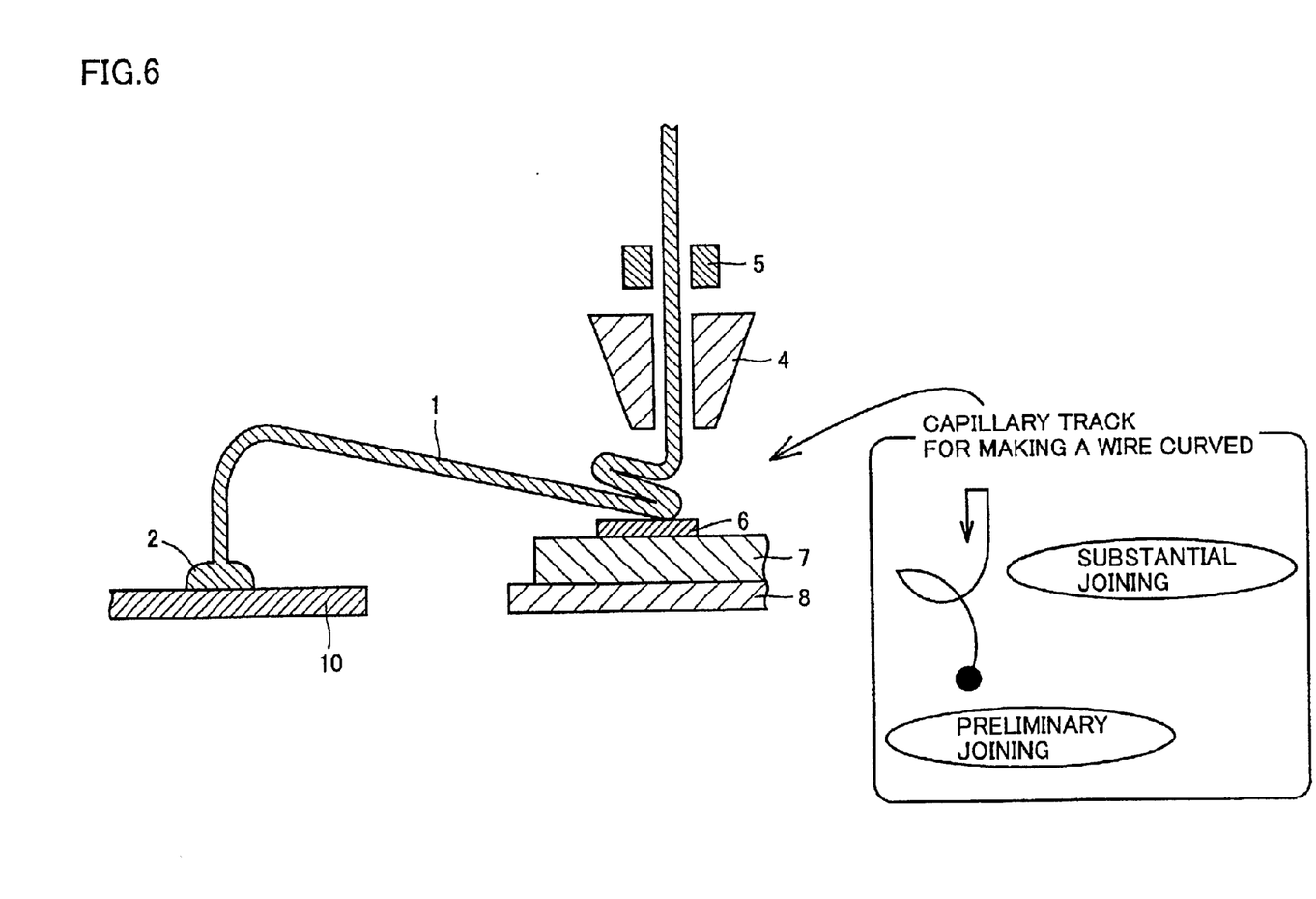
FIG. 6 is a side view showing a characteristic step of manufacturing a semiconductor device in accordance with a second embodiment of the present invention.

Second embodiment of the present invention will be described with reference to FIG. 6. FIG. 6 illustrates the method of second ball bonding in accordance with the second embodiment.

In the first embodiment described above, the second ball bonding is performed by bending bonding wire 1. The second ball bonding may be realized by making bonding wire 1 curved.

Formation of the second ball by making the wire curved follows the same steps as the first embodiment, and after the preliminary joining shown in FIG. 3, the bonding wire 1 is curved by an arcuate operation of capillary 4 shown in FIG. 6, for substantial joining. After substantial joining, bonding wire 1 is clamped by wire cut damper 5 as shown in FIG. 5, and the bonding wire 1 is cut. Thus, the structure of the present embodiment is obtained.

In the second embodiment also, as in the first embodiment, positional accuracy in forming the second ball can be improved, control of the wire loop can be performed with higher accuracy, and stability of the second ball bonding is also improved.

Third Embodiment

A third embodiment of the present invention will be described with reference to FIG. 7. FIGS. 7A to 7C are cross sectional views showing the overall structure of the semiconductor device in accordance with the present invention manufactured through the wire bonding technique described above.

Figure 7A:
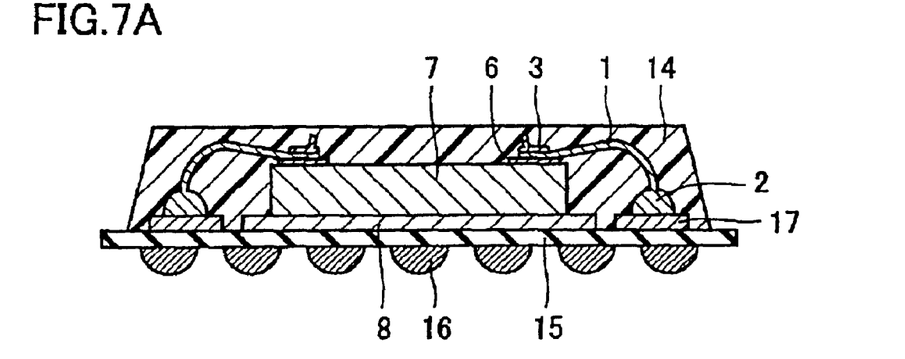
FIG. 7A is a cross sectional view of a thin package to which the present invention is applied.
Figure 7B:
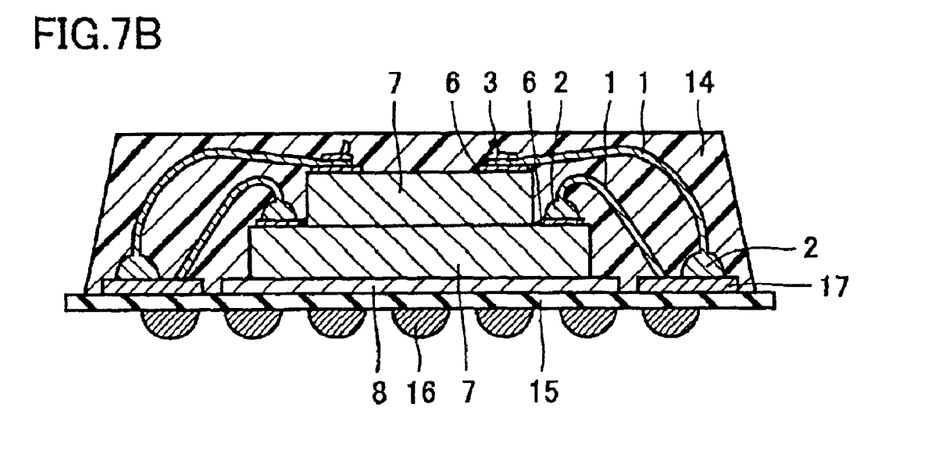
FIG. 7B is a cross sectional view of a compact-sized, large capacity package to which the present invention is applied.
Figure 7C:
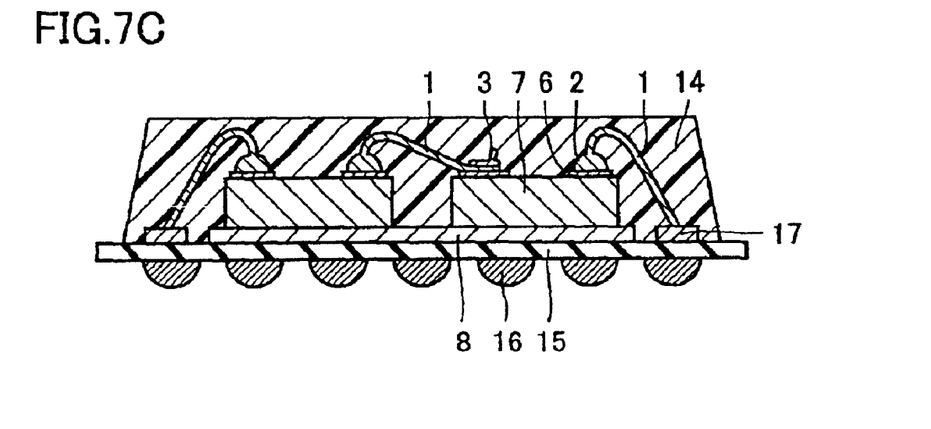
FIG. 7C is a cross sectional view showing a system-in-package to which the present invention is applied.

FIG. 7A shows an example of a thin package, FIG. 7B shows an example of a compact-sized, large capacity package, and FIG. 7C shows an example of a system-in-package.

The thin package shown in FIG. 7A includes a base 15 formed, for example, of an insulating material, a semiconductor device 7 mounted on base 15, and an external terminal 16. On base 15, a die pad 8 and a land 17 formed of a conductive member are provided, and semiconductor device 7 is mounted on die pad 8.

On land 17, a first ball 2 is formed, a second ball 3 is formed on bonding pad 6 of semiconductor device 7, and first and second balls 2 and 3 are connected by means of bonding wire 1. Semiconductor device 7 is sealed by a mold resin 14, so that bonding wire 1, first and second balls 2 and 3, bonding pad 6 and land 17 are covered by mold resin 14.

In the compact-sized, large capacity package shown in FIG. 7B, semiconductor devices 7 are stacked, and bonding pads 6 of the semiconductor devices 7 are connected to land 17 by means of bonding wires 1.

In the system-in-package shown in FIG. 7C, a plurality of semiconductor devices 7 are mounted spaced apart from each other on die pad 8. Bonding pads 6 of semiconductor devices 7 are connected to each other by means of a bonding wire 1.

As described above, the present invention is applicable to various types of packages developed recently. Here, as the second ball 3 can be formed at a desired position with high accuracy, loop control of bonding wire 1 can be performed with high accuracy. This enables highly accurate control of interconnection of the integrated wires. Further, as the second bonding is performed in two steps including preliminary joining and the substantial joining, stability of the joint of the second bonding is also improved.

Further, as the step of stud bump can be omitted in the manufacturing process, operation of the torch electrode 11 to form the second ball 3 becomes unnecessary. Accordingly, it is possible to form the second ball 3 simply by the operation of capillary 4, speeding up the step of wire bonding.

In the semiconductor device in accordance with the present invention, loop control of the bonding wire is possible in an easy and highly accurate manner, and hence the loop of a desired shape can be obtained easily. Further, the second ball can be formed easily and stably as compared with the melted ball. Thus, stability and reliability of joining by the second bond can also be improved.

By the method of manufacturing a semiconductor device in accordance with the present invention, the second ball can be formed easily and stably, and formation of a stud bump is unnecessary. Thus, ball-to-ball bonding can be performed stably at high speed. As the second ball and the second conductive layer are joined through stepwise joining process, stability of the joint between the second ball and the second conductive layer can be improved.

Thus, by the present invention, not only the quality but also the productivity of the semiconductor devices can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a conductive layer;
   a first contact comprising a ball on said conductive layer;
   a first bonding pad spaced apart from said conductive layer; and
   a bonding wire electrically connecting said first contact to said first bonding pad and forming a second contact, said second contact including at least first and second layers of said bonding wire, lying directly on each other, so that said bonding wire includes at least one reverse bend, and said first layer is joined to both of said first bonding pad and said second layer and is between said second layer and said first bonding pad, directly opposite said first bonding pad.

2. The semiconductor device according to claim 1, wherein said conductive layer includes an inner lead.

3. The semiconductor device according to claim 1, comprising
   a base;
   a semiconductor element on said base with a die pad interposed between said semiconductor element and said base;

a sealing resin sealing said semiconductor element; and an external terminal on a rear surface of said base, wherein said conductive layer includes a land on said base, and said first bonding pad is on said semiconductor element.

4. The semiconductor device according to claim 1, comprising:

a base;

first and second semiconductor elements mounted on said base with a die pad interposed between said base and said first and second semiconductor elements;

a sealing resin sealing said first and second semiconductor elements; and an external terminal on a rear surface of said base, wherein said conductive layer includes a second bonding pad on said first semiconductor element, and said first bonding pad is on said second semiconductor element.

5. A method of manufacturing a semiconductor device, comprising, sequentially:

joining a ball at a tip end of a bonding wire to a conductive layer as a first contact;

joining a first part of said bonding wire directly to a bonding pad;

mechanically deforming a second part of said bonding wire, while said first part of said bonding ire is joined to said bonding pad, so that said second part of said bonding wire, is folded onto aid first part of said bonding wire, directly opposite said bonding pad with said first part of said bonding wire between said bonding pad and said second part of said bonding wire; and joining said second part of said bonding wire to said first part of said bonding wire while said firs part of said bonding wire is on said bonding pad.

6. The method of manufacturing a semiconductor device according to claim 5, wherein said bonding wire is held by a bonding tool; and mechanically deforming said bonding wire includes mechanically deforming said bonding wire on said bonding pad by moving said bonding tool with said bonding wire joined to said bonding pad.

* * * * *